United States Patent
Yamazaki et al.

(10) Patent No.: US 8,557,614 B2
(45) Date of Patent: Oct. 15, 2013

(54) METHOD FOR MANUFACTURING LIGHTING DEVICE

(75) Inventors: Shunpei Yamazaki, Setagaya (JP); Yasuyuki Arai, Atsugi (JP); Naoto Kusumoto, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/336,356

(22) Filed: Dec. 23, 2011

(65) Prior Publication Data

US 2012/0164761 A1 Jun. 28, 2012

(30) Foreign Application Priority Data

Dec. 28, 2010 (JP) ................................. 2010-293534

(51) Int. Cl.
*H01L 21/66* (2006.01)

(52) U.S. Cl.
USPC ............................................. 438/15; 438/16

(58) Field of Classification Search
None
See application file for complete search history.

(56) References Cited

U.S. PATENT DOCUMENTS

| | | | |
|---|---|---|---|
| 4,725,558 A | 2/1988 | Yamazaki et al. | |
| 4,749,454 A * | 6/1988 | Arya et al. | 205/656 |
| 4,786,607 A | 11/1988 | Yamazaki et al. | |
| 4,812,415 A | 3/1989 | Yamazaki et al. | |
| 4,937,651 A | 6/1990 | Yamazaki et al. | |
| 5,089,426 A | 2/1992 | Yamazaki et al. | |
| 6,809,023 B2 | 10/2004 | Arai et al. | |
| 6,953,717 B2 | 10/2005 | Arai et al. | |
| 7,501,653 B2 | 3/2009 | Arai et al. | |
| 7,851,989 B2 * | 12/2010 | Noda | 313/503 |
| 2003/0006699 A1 * | 1/2003 | Ogino et al. | 313/506 |
| 2007/0007538 A1 * | 1/2007 | Ono et al. | 257/79 |
| 2008/0233826 A1 * | 9/2008 | Matsuda | 445/2 |
| 2009/0165854 A1 * | 7/2009 | Yamazaki et al. | 136/258 |
| 2011/0027918 A1 | 2/2011 | Tanaka | |
| 2011/0136266 A1 * | 6/2011 | Yamagata et al. | 438/4 |
| 2011/0278603 A1 * | 11/2011 | Miyazawa et al. | 257/88 |

FOREIGN PATENT DOCUMENTS

JP 2003-017262 1/2003

* cited by examiner

*Primary Examiner* — Robert J Hoffberg
*Assistant Examiner* — Priya Rampersaud
(74) *Attorney, Agent, or Firm* — Eric J. Robinson; Robinson Intellectual Property Law Office, P.C.

(57) ABSTRACT

An object is to provide a method for manufacturing a lighting device, in which a problem of a short circuit between an upper electrode and a lower electrode of a light-emitting element is solved without reducing a light-emitting property of a normal portion of the light-emitting element to the utmost. In a light-emitting element including an upper electrode, an electroluminescent layer, and a lower electrode, a short-circuited portion that is undesirably formed between the upper electrode and the lower electrode is irradiated with a laser beam, whereby a region where the short-circuited portion is removed is formed, and then the region is filled with an insulating resin having a light-transmitting property. Thus, the problem of the short circuit between the upper electrode and the lower electrode is solved and yield of a lighting device is improved.

24 Claims, 7 Drawing Sheets

METHOD FOR MANUFACTURING LIGHTING DEVICE

BACKGROUND OF THE INVENTION

1. Field of the Invention

One embodiment of the present invention relates to a method for manufacturing a lighting device including a method for repairing a light-emitting element.

2. Description of the Related Art

In recent years, as one of next-generation lighting devices, a light-emitting element which contains an organic compound or an inorganic compound and emits light by voltage application (the light-emitting element is also referred to as an electroluminescent element) has been developed.

The light-emitting element includes at least an upper electrode, an electroluminescent layer, and a lower electrode and the electroluminescent layer emits light in accordance with voltage applied between the upper electrode and the lower electrode.

For example, the light-emitting element can be manufactured in such a manner that a lower electrode is formed, an electroluminescent layer is formed over the lower electrode, and an upper electrode is formed over the electroluminescent layer.

However, a defect is caused in the electroluminescent layer at the time of the manufacture of the light-emitting element. The defect is frequently caused, for example, due to a foreign substance or the like on the lower electrode. For example, when the upper electrode is formed over the electroluminescent layer under the presence of the defect, there is a high possibility that part of the upper electrode is formed in the defect and is in contact with the lower electrode, which causes a short circuit between the upper electrode and the lower electrode.

As an example of the technique of preventing a short circuit between the upper electrode and the lower electrode, a technique is given in which a defect in an electroluminescent layer is filled with an insulating material, so that a short circuit between an upper electrode and a lower electrode is prevented (e.g., Patent Document 1).

[REFERENCE]

[Patent Document 1] Japanese Published Patent Application No. 2003-017262

SUMMARY OF THE INVENTION

Since, the technique of preventing a short circuit described in Patent Document 1 is a technique using an electrodeposition method, and there has been a problem in that a defective portion where much current flows can be preferentially filled with an insulating material; however, a region except for the defective portion where much current flows is also filled with the insulating material. When the insulating material exists on the portion other than the defect portion in the electroluminescent layer, the insulating material serves as resistance, which causes a reduction in a light-emitting property of a light-emitting element.

Therefore, an object of one embodiment of the present invention is to provide a method in which a problem of a short circuit between an upper electrode and a lower electrode of a light-emitting element is solved without reducing a light-emitting property of a normal portion of the light-emitting element to the utmost.

One embodiment of the present invention disclosed in this specification relates to a method for manufacturing a lighting device, in which, in a light-emitting element including an upper electrode, an electroluminescent layer, and a lower electrode, a short-circuited portion that is undesirably formed between the upper electrode and the lower electrode is irradiated with a laser beam, whereby a region where the short-circuited portion is removed is formed, and then the region is filled with an insulating resin; thus, the problem of the short circuit between the upper electrode and the lower electrode is solved.

One embodiment of the present invention disclosed in this specification is a method for manufacturing a lighting device, in which a first electrode is formed; an electroluminescent layer in contact with the first electrode is formed; a second electrode over and in contact with the electroluminescent layer is formed, whereby a light-emitting element is formed; a position of a short-circuited portion between the first electrode and the second electrode is specified; a region where the short-circuited portion is removed by irradiating the short-circuited portion with a laser beam is formed; a liquid insulating resin is locally supplied so that the region is filled and covered with the liquid insulating resin; and the liquid insulating resin is cured.

In this specification and the like, ordinal numbers such as "first" and "second" are used to avoid confusion among components, and the terms do not limit the order and number of the components.

Another embodiment of the present invention disclosed in this specification is a method for manufacturing a lighting device, in which a first electrode and a second electrode are formed; a first electroluminescent layer in contact with the first electrode and a second electroluminescent layer in contact with the second electrode are formed; a third electrode in contact with the first electroluminescent layer and a fourth electrode in contact with the second electroluminescent layer and the first electrode are formed; a first light-emitting element including the first electrode, the first electroluminescent layer, and the third electrode and a second light-emitting element including the second electrode, the second electroluminescent layer, and the fourth electrode are electrically connected in series; a position of a short-circuited portion between the first electrode and the third electrode and a position of a short-circuited portion between the second electrode and the fourth electrode are specified; each region where the short-circuited portion is removed by irradiating the short-circuited portion with a laser beam is formed; a liquid insulating resin is locally supplied so that each of the regions is filled and covered with the liquid insulating resin; and the liquid insulating resin is cured.

The position of the short-circuited portion can be specified by detecting a change in a state of the light-emitting element caused by applying a reverse bias to the light-emitting element.

Further, the position of the short-circuited portion can be indirectly specified by observing a surface condition of the light-emitting element and detecting a defective portion where a pinhole, a foreign substance, or the like exists using an image analysis.

For the insulating resin for filling a region where the short-circuited portion is removed, an insulating resin having a light-transmitting property with respect to the wavelength of light emitted from the electroluminescent layer is used. Further, it is preferable that the insulating resign be formed using a material having a higher refractive index than the electroluminescent layer 104b.

According to one embodiment of the present invention, a problem of a short circuit between an upper electrode and a lower electrode of a light-emitting element can be solved. Further, the problem of the short circuit can be solved without reducing a light-emitting property of a normal portion of the light-emitting element, and yield of a lighting device can be improved.

DETAILED DESCRIPTION OF THE INVENTION

Figure 1A:
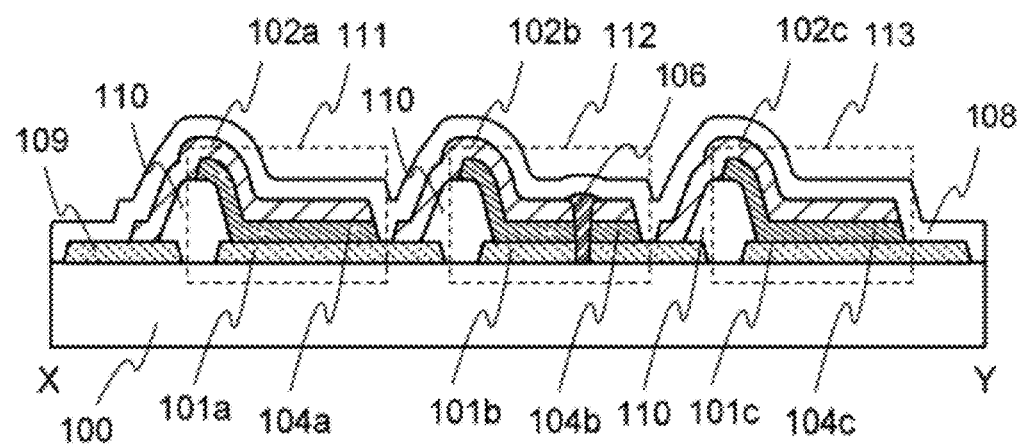
FIGS. 1A and 1B are a cross-sectional view and a plan view illustrating a lighting device according to one embodiment of the present invention, respectively.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. Note that in all the drawings for explaining the embodiments, like portions or portions having a similar function are denoted by the same reference numerals, and the description thereof is omitted in some cases.
(Embodiment 1)

In this embodiment, a lighting device according to one embodiment of the present invention and a manufacturing method thereof will be described. FIG. 1A is a cross-sectional view illustrating a structural example of a lighting device in this embodiment. Note that FIG. 1A corresponds to a cross-sectional view along line X-Y in a plan view of FIG. 1B.

First, a structure of the lighting device according to one embodiment of the present invention will be described.

The lighting device illustrated in FIG. 1A has a structure in which a first light-emitting element 111, a second light-emitting element 112, and a third light-emitting element 113 are electrically connected in series over a substrate 100. Note that each of the light-emitting elements is a so-called light-emitting diode in which an electroluminescent layer can emit light in accordance with voltage applied between an upper electrode and a lower electrode.

The first light-emitting element 111 includes a first electrode 101a, an electroluminescent layer 104a in contact with the first electrode, and a second electrode 102a in contact with the electroluminescent layer. The second light-emitting element 112 includes a first electrode 101b, an electroluminescent layer 104b in contact with the first electrode, and a second electrode 102b in contact with the electroluminescent layer. The third light-emitting element 113 includes a first electrode 101c, an electroluminescent layer 104c in contact with the first electrode, and a second electrode 102c in contact with the electroluminescent layer.

Here, a hole is formed in the first electrode 101b, the electroluminescent layer 104b, and the second electrode 102b of the second light-emitting element 112 and the hole is filled with an insulating resin 106 and an upper portion of the hole is covered with the insulating resin 106. The region where the hole is formed has been conventionally a short-circuited portion between the first electrode 101b and the second electrode 102b. By removal of the short-circuited portion, the problem of the short circuit is solved and by filling the region with the insulating resin, the electroluminescent layer is protected.

Further, as long as a short-circuited portion between the first electrode 101b and the second electrode 102b is removed, the hole penetrating the first electrode 101b is not necessarily formed. Note that in this embodiment the case where one short-circuited portion is caused in the second light-emitting element 112 is described as an example; however, there is no limitation on a light-emitting element in which a short circuit is caused and the number of short-circuited portions.

For the insulating resin 106, a resin having a light-transmitting property with respect to light emitted from the electroluminescent layer is used. The insulating resin 106 has a light-transmitting property, whereby light emitted from a peripheral electroluminescent layer can be guided to the insulating resin and light can also be transmitted through the insulating resin 106 outside. Therefore, the region filled with the insulating resin 106 does not become a dark spot and yield of a lighting device can be improved in appearance.

The second electrode 102b crosses over one of partitions 110 to be in contact with the first electrode 101a and the second electrode 102c crosses over one of partitions 110 to be in contact with the first electrode 101b. Further, the second electrode 102a crosses over the partition 110 to be in contact with a terminal 109. Accordingly, the lighting device in this embodiment has a structure in which the first light-emitting element 111, the second light-emitting element 112, and the third light-emitting element 113 are electrically connected in series between the terminal 109 and the first electrode 101c and each light-emitting element can emit light by applying appropriate voltage between the terminal 109 and the first electrode 101c. Note that the terminal 109 is one of the electrodes of the light-emitting elements electrically connected in series and the first electrode 101c serves as the other electrode.

Further, in this embodiment, the case where a structure in which the first light-emitting element 111, the second light-emitting element 112, and the third light-emitting element 113 are electrically connected in series is described as an example; however, the number of the light-emitting elements electrically connected in series can be freely determined by a practitioner. Furthermore, a plurality of the light-emitting elements or a group of a plurality of the light-emitting elements electrically connected in series can be electrically connected in parallel.

For the first electrodes 101a, 101b, and 101c, a metal such as molybdenum, titanium, chromium, tantalum, tungsten, aluminum, copper, neodymium, or scandium can be used. In addition, a metal oxide such as indium oxide ($In_2O_3$), tin oxide ($SnO_2$), zinc oxide (ZnO), indium tin oxide ($In_2O_3$—$SnO_2$, which is abbreviated to ITO in some cases), or indium zinc oxide ($In_2O_3$—ZnO); or the metal oxide containing silicon, silicon oxide, or nitrogen can be used, for example. Note that a material obtained by stacking any of the above metals and metal oxides can be used for the first electrodes. Further, a material formed of 1 to 10 graphene sheets may be used.

Here, when the light-emitting element in this embodiment has a structure to emit light toward the top side (also referred to as a top emission structure) or toward both the top and bottom sides (also referred to as a dual emission structure), any of the above materials which transmits light emitted from the light-emitting element can be used for the first electrode. When the light-emitting element in this embodiment has a structure to emit light toward the bottom side (also referred to as a bottom emission structure), any of the above materials which reflects light emitted from the light-emitting element can be used for the first electrode. Note that the terminal 109 can be formed using any of the materials which can be used for the first electrode.

The electroluminescent layers 104a, 104b, and 104c each emit light of a particular color.

The electroluminescent layer includes at least a light-emitting layer. As the light-emitting layer, a layer including an electroluminescent material such as a fluorescent material or a phosphorescent material can be used.

The electroluminescent layer can also be formed by stacking the above light-emitting layer and another layer. In the case of the electroluminescent layer having a stacked structure, it is preferable that the uppermost layer of the electroluminescent layer be a metal oxide layer. At this time, it is preferable that the metal oxide layer have conductivity. The uppermost layer of the electroluminescent layer is a metal oxide layer, whereby deterioration of the electroluminescent layer can be suppressed when a light-emitting element is manufactured and a reduction in a light-emitting property of the light-emitting element can be suppressed.

For the above metal oxide layer, a transition metal oxide layer or an oxide layer of a metal belonging to any of Groups 4 to 8 of the periodic table can be used. The above metal oxide layer can be, for example, a layer formed using a material such as vanadium oxide, niobium oxide, tantalum oxide, chromium oxide, molybdenum oxide, tungsten oxide, manganese oxide, or rhenium oxide. A stack of layers of materials each applicable to the above metal oxide layer can also be used to form the metal oxide layer. For example, a molybdenum oxide layer has low hygroscopicity; therefore, when the above metal oxide layer is formed using the molybdenum oxide layer, deterioration of the electroluminescent layer can be suppressed at the time of the manufacture of the light-emitting element and a reduction in a light-emitting property of the light-emitting element can be suppressed.

The second electrodes 102a, 102b, and 102c can be formed using, for example, a metal such as molybdenum, titanium, chromium, tantalum, tungsten, aluminum, copper, neodymium, or scandium. Further, a metal oxide such as indium oxide ($In_2O_3$), tin oxide ($SnO_2$), zinc oxide (ZnO), indium tin oxide ($In_2O_3$—$SnO_2$), or indium zinc oxide ($In_2O_3$—ZnO); or the metal oxide containing silicon, silicon oxide, or nitrogen can be used. Alternatively, each of the second electrodes can be formed by stacking layers using any of the above materials. Further, a material formed of 1 to 10 graphene sheets may be used. Here, when the light-emitting element has a structure to emit light toward the top side, a layer of any of the above materials which transmits light emitted from the light-emitting element can be used for the second electrode. When the light-emitting element has a structure to emit light toward the bottom side, a layer of any of the above materials which reflects light emitted from the light-emitting element can be used for the second electrode.

Further, in order to prevent deterioration due to entry of moisture or the like into the electroluminescent layers 104a, 104b, and 104c, it is preferable that a protective film 108 be formed to cover the first light-emitting element 111, the second light-emitting element 112, and the third light-emitting element 113. The protective film 108 can be formed to have a single layer structure or a stacked layer structure of a silicon nitride film, a silicon nitride oxide film, and/or an aluminum oxide film.

Note that a control circuit for controlling light emission of the light-emitting element in this embodiment may be provided in a lighting device.

Figure 7A:
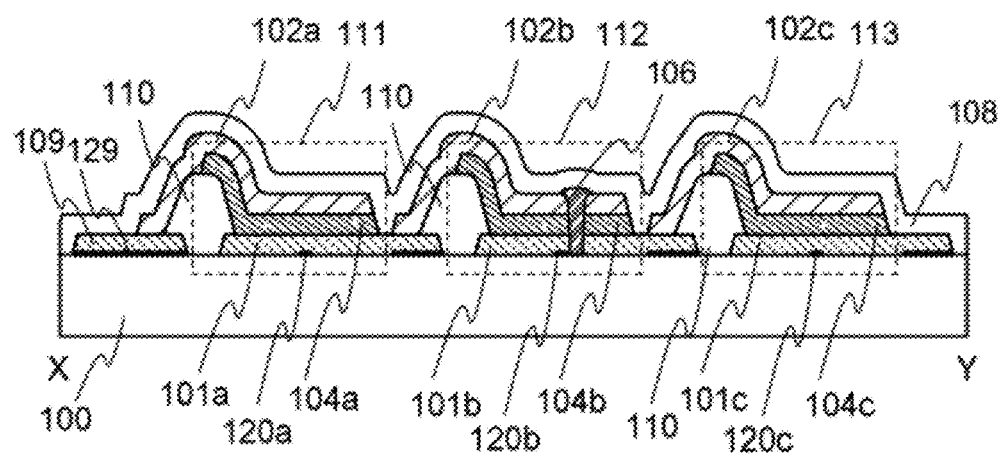
FIGS. 7A and 7B are a cross-sectional view and a plan view illustrating a lighting device according to one embodiment of the present invention, respectively.
Figure 7B:
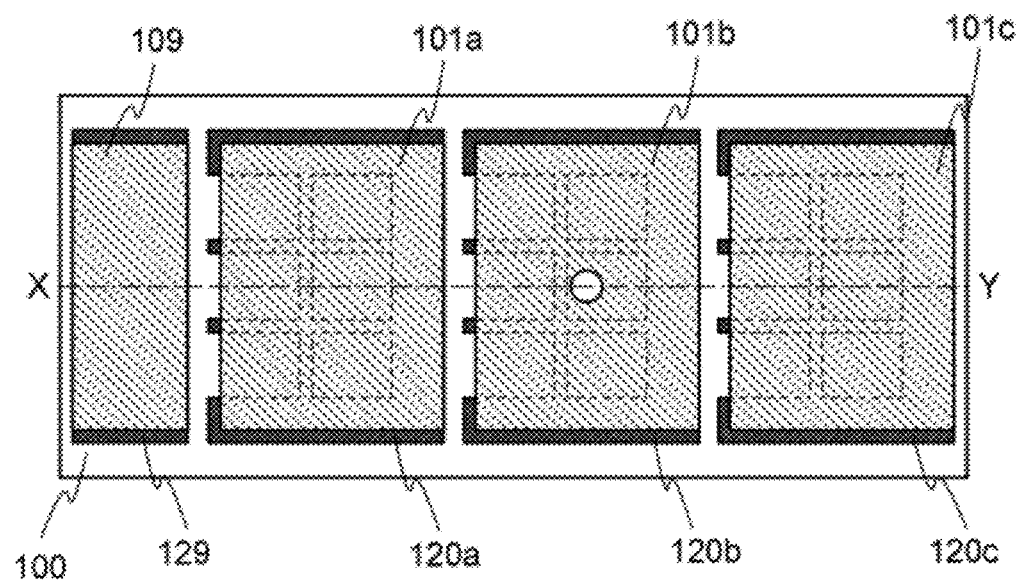

Further, as illustrated in FIGS. 7A and 7B, the first electrodes 101a, 101b, and 101c may be provided with auxiliary electrodes 120a, 120b, and 120c, respectively. Note that the auxiliary electrodes are provided on the side through which light is emitted. Accordingly, FIGS. 7A and 7B illustrate an example of a structure in which light is emitted toward the bottom side.

Figure 1B:
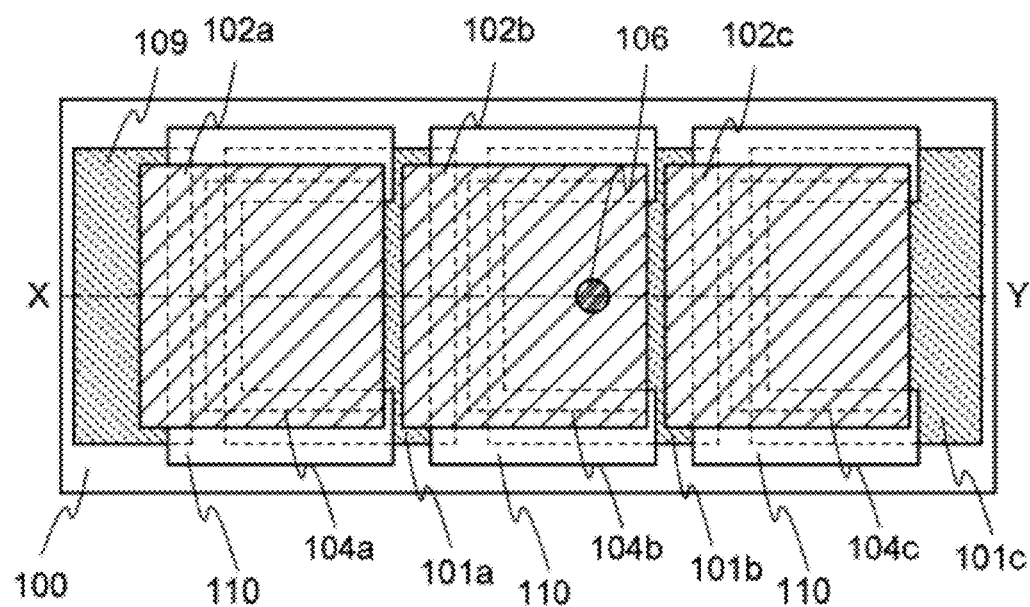

FIG. 7A is a cross-sectional view illustrating a structure in which the auxiliary electrodes 120a, 120b, and 120c are added to the lighting device of FIGS. 1A and 1B. FIG. 7B is a plan view of FIG. 7A; however, for simplicity of description of the auxiliary electrodes 120a, 120b, and 120c, only the auxiliary electrodes, the first electrodes 101a, 101b, and 101c, and the terminal 109 are illustrated. The other structures are the same as those in FIG. 1B.

Although the auxiliary electrodes 120a, 120b, and 120c in grid patterns are illustrated as an example, the auxiliary electrodes in stripes may be used. The electrodes on the side through which light is emitted (here, the first electrodes 101a, 101b, and 101c) need to have a light-transmitting property; therefore, a material with relatively high resistance needs to be used. Accordingly, an auxiliary wiring using a low resistance metal such as copper is provided, whereby a loss due to resistance can be improved.

Although the auxiliary electrodes 120a, 120b, and 120c are provided in portions overlapping with light-emitting regions, the width and thickness of each of the auxiliary electrodes are small, whereby influence of light-blocking can be substantially ignored. Note that the thickness of the auxiliary electrode which does not overlap with the light-emitting region may be increased, so that resistance is reduced. In this case, the region can also be referred to as an auxiliary wiring. Further, the terminal 109 and a conductive layer 129 which is formed using the same material as the auxiliary electrode can be stacked; therefore, resistance can be reduced.

Note that in FIGS. 7A and 7B, the auxiliary electrodes 120a, 120b, and 120c are formed below the first electrodes 101a, 101b, and 101c; alternatively, the auxiliary electrodes can be formed above the first electrodes.

Next, a method for manufacturing the lighting device illustrated in FIGS. 1A and 1B according to one embodiment of the present invention will be described with reference to cross-sectional views of manufacturing processes of FIGS. 2A to 2D and FIGS. 3A to 3D.

Figure 2A:
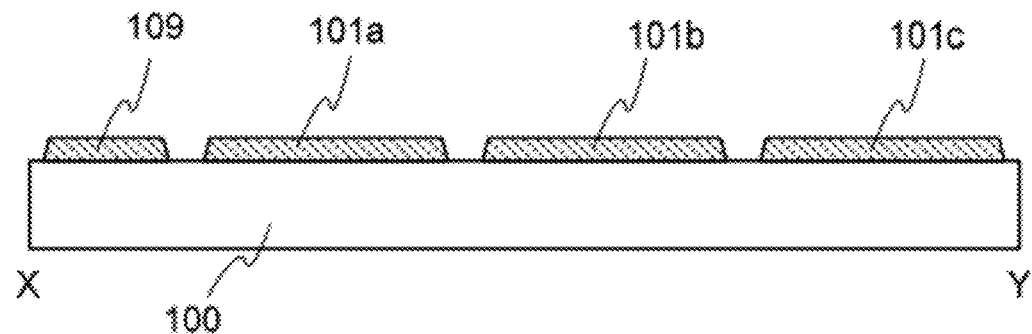
FIGS. 2A to 2D are cross-sectional process views illustrating a method for manufacturing a lighting device according to one embodiment of the present invention.

First, the first electrodes 101a, 101b, and 101c and the terminal 109 are formed over the substrate 100 (see FIG. 2A). After a conductive layer is formed, the electrodes and the terminal can be formed by a photolithography step and an etching step, or a laser process. It is preferable that the conductive layer be formed using any of the materials which can be used for the first electrodes 101a, 101b, and 101c. For example, the conductive layer can be formed using a sputtering method or an evaporation method. Although not illustrated, an insulating film may be formed over the substrate 100 in order to prevent deterioration of the electroluminescent layer. The insulating film can be formed using any of the materials which can be used for the above protective film 108.

Note that in the case where a lighting device having the structure illustrated in FIGS. 7A and 7B is manufactured, it is preferable that the auxiliary electrodes 120a, 120b, and 120c be formed before the first electrodes are formed.

A glass substrate, a ceramic substrate, a resin substrate, or a metal substrate whose surface is subjected to insulation treatment can be used for the substrate 100 as long as a surface of the substrate 100 has an insulating property. Note that in the case where a light-emitting element that is configured to emit light toward the bottom side is formed, a substrate having a light-transmitting property is used. In addition, these substrates may be flexible substrates. By use of a flexible substrate, a lighting device having a curved surface or the like can be easily manufactured.

Next, the partitions 110 are formed to fill a space between the terminal 109 and the first electrode 101a, a space between the first electrode 101a and the first electrode 101b, and a space between the first electrode 101b and the first electrode 101c. The partition 110 can prevent disconnection of an electroluminescent layer or a second electrode to be formed over the first electrode later. Note that the partition 110 can be formed using an organic resin film, an inorganic insulating film, or organic polysiloxane. In addition, a cross section of the side surface of the partition is not limited to a tapered shape, and may be vertical or a reverse tapered shape.

Figure 2B:
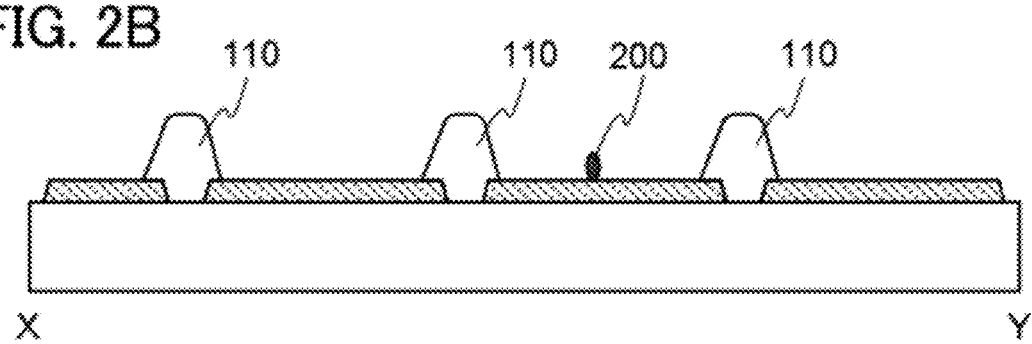

An example in which a foreign substance 200 is accidentally attached onto the first electrode 101b at any timing before the subsequent formation of the electroluminescent layer will be described below (see FIG. 2B). Note that there is no limitation on the timing at which the foreign substance 200 is attached onto the substrate 100 or a structure over the substrate 100. For example, the foreign substance 200 is attached onto the substrate 100 before the first electrodes 101a, 101b, and 101c are formed, in some cases.

Next, the electroluminescent layers 104a, 104b, and 104c are formed so as to be in contact with the first electrodes 101a, 101b, and 101c and the partitions 110. The electroluminescent layers can be formed by a vacuum evaporation method, an inkjet method, a spin coating method, or the like, for example. Here, it is preferable that the uppermost layers of the electroluminescent layers 104a, 104b, and 104c be metal oxide layers. The metal oxide layers can be formed by a sputtering method, a vacuum evaporation method, an inkjet method, a spin coating method, or the like, for example.

Figure 2C:
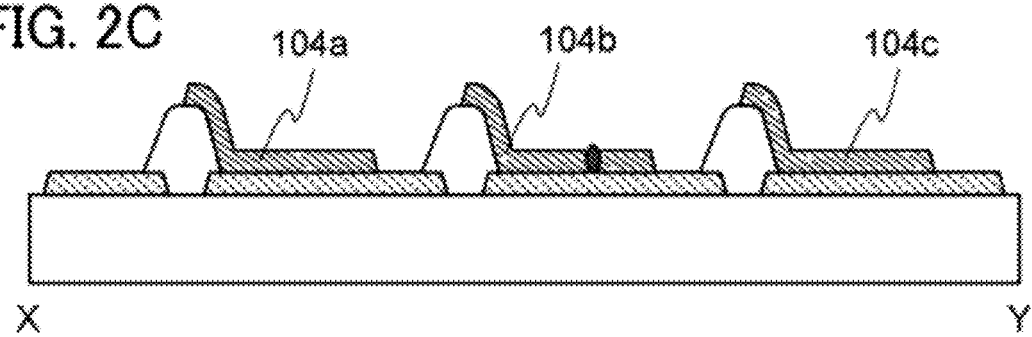

At this time, the foreign substance 200 attached onto the first electrode 101b generates a region where the electroluminescent layer 104b is not formed (see FIG. 2C).

Figure 2D:
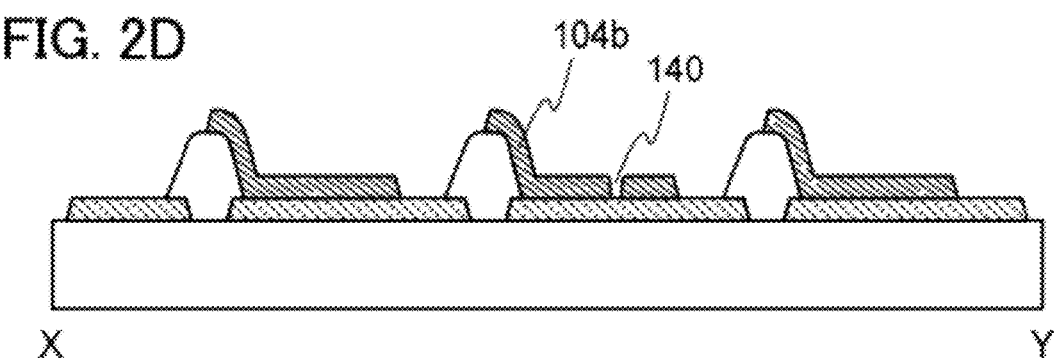

The foreign substance 200 is unstably attached onto the first electrode 101b; therefore, the foreign substance 200 is easily moved by vibration or the like and the above region where the electroluminescent layer 104b is not formed becomes as a pinhole 140 (see FIG. 2D).

Figure 3A:
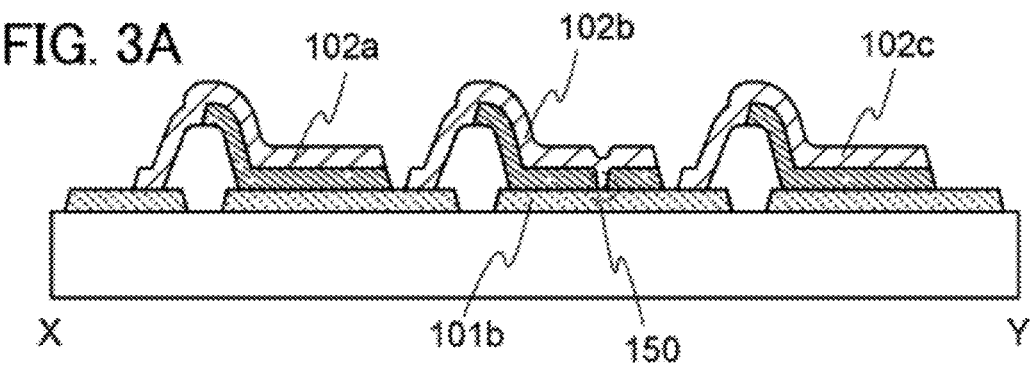
FIGS. 3A to 3D are cross-sectional process views illustrating a method for manufacturing a lighting device according to one embodiment of the present invention.
Figure 3B:
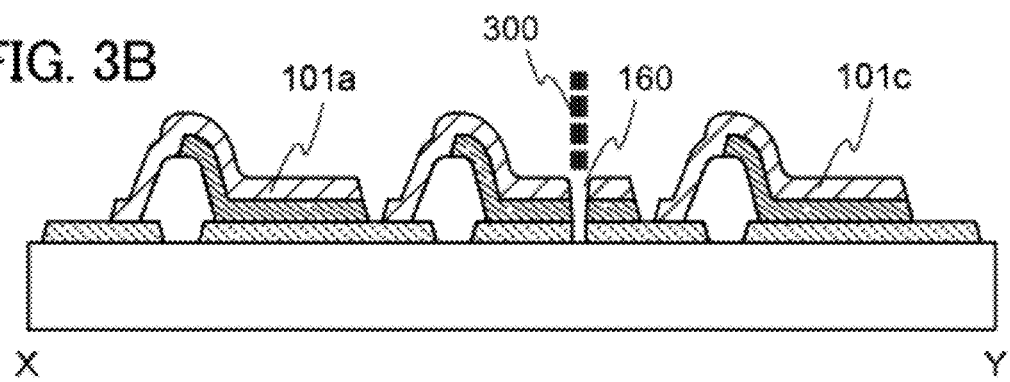

Next, the second electrodes 102a, 102b, and 102c are formed over the electroluminescent layers 104a, 104b, and 104c, respectively (see FIG. 3A). At this time, the pinhole 140 is formed in the electroluminescent layer 104b; therefore, part of the second electrode 102b enters the pinhole 140 and a short-circuited portion 150 between the first electrode 101b and the second electrode 102b is formed.

In some cases, the foreign substance 200 is not moved and the second electrodes 102a, 102b, and 102c are formed over the electroluminescent layers 104a, 104b, and 104c in a state illustrated in FIG. 2C. Also in these cases, when the foreign substance 200 has conductivity, a short circuit between the first electrode 101b and the second electrode 102b is easily caused. Further, even when the foreign substance 200 is an insulator, a short circuit may be caused by electric-field concentration or the like during electrical condition.

Next, a step of detecting the short-circuited portion described above is performed. The light-emitting element is a light-emitting diode, which is one of nonlinear elements, and normally almost no current flows when a reverse bias voltage is applied. However, in the case where there is a short-circuited portion between an upper electrode and a lower electrode, a relatively large current flows is concentrated in the short-circuited portion. In a portion where a large current flows, heat generation causes an electrode or the peripheral electroluminescent layer to change in quality with color change or the like; therefore, the short-circuited portion can be specified visually. Accordingly, when an image is obtained and means or the like for analyzing the image are combined, the position of the short-circuited portion can be easily specified.

Further, a short-circuited portion and a portion where a short circuit may be caused can be indirectly detected by detecting a pinhole or a foreign substance. A pinhole or a foreign substance can be detected using a means for analyzing an image by obtaining the image, a means for analyzing a reflected light of laser beam, or the like.

For example, in the means for analyzing an image, an image of a surface of a light-emitting element is obtained using an imaging means such as a high-powered camera and the image is analyzed, whereby a pinhole or a foreign substance is detected and the position can be specified. Further, for the means for analyzing a reflected light of laser beam, for example, a laser displacement sensor can be used. A laser displacement sensor is a device capable of finding out the position and the shape of an object by detecting a displacement of the reflected light of laser beam when the object is irradiated with a laser beam. With the use of the device, a pinhole or a foreign substance is detected and the position can be specified.

Next, the short-circuited portion specified by the above method is irradiated with a laser beam 300 and the short-circuited portion is removed by evaporation or ablation, whereby a problem of a short circuit is solved. Here, only the short-circuited portion may be removed or the short-circuited portion and the peripheral portion may be removed. In the former, the amount of the electroluminescent layer to be removed is small; therefore, reduction in emission efficiency of a lighting device can be suppressed as much as possible. In the latter, filling the region where the short-circuited portion is removed with an insulating resin, which is described later, can be easily performed. In this embodiment, with the use of the latter method, a region 160 where part of the first electrode 101b, part of the electroluminescent layer 104b, and part of the second electrode 102b are removed is formed (see FIG. 3B).

Here, for the irradiation of the short-circuited portion with a laser beam, for example, the fundamental wave (wavelength: 1064 nm), the second harmonic (wavelength: 532 nm), or the third harmonic (wavelength: 355 nm) of an Nd:YAG laser can be used. Alternatively, a dye laser having a wavelength which is greater than or equal to 375 nm and less than or equal to 900 nm can be used. The wavelength of the dye laser beam to be oscillated can be selected by adjusting a laser dye such as coumarin or rhodamine.

Next, with the use of a means for discharging liquid, a step in which the region 160 is filled with a liquid insulating resin is performed. For the means for discharging liquid, an inkjet method or a dispensing method can be used. In the inkjet method, a droplet can be small; therefore, the amount of discharge can be easily controlled. Further, in the dispensing method, even liquid having relatively high viscosity can be discharged; therefore, there is an advantage that the resin material can be easily selected or the like. Here, it is preferable that the liquid insulating resin be discharged so as to cover the region 160 in order to prevent insufficient filling.

Note that the liquid insulating resin includes a liquid insulating resin having plasticity in the filling step. For example, a gel-like insulating resin or a paste insulating resin may be used.

For the liquid insulating resin, a thermosetting resin, an ultraviolet curable resin, or a thermosetting and ultraviolet curable resin can be used. After any of these resins or resins in which these resins are mixed is discharged into the region 160, the thermosetting resin is cured by heating and the ultraviolet curable resin is cured by irradiation with ultraviolet rays. Further, the thermosetting and ultraviolet curable resin is cured by irradiation with ultraviolet rays and then by heating. In the case where the material used for the electroluminescent layer is an organic substance whose allowable temperature limit is low, it is preferable that the ultraviolet curable resin which can be cured at room temperature be used.

Figure 3C:
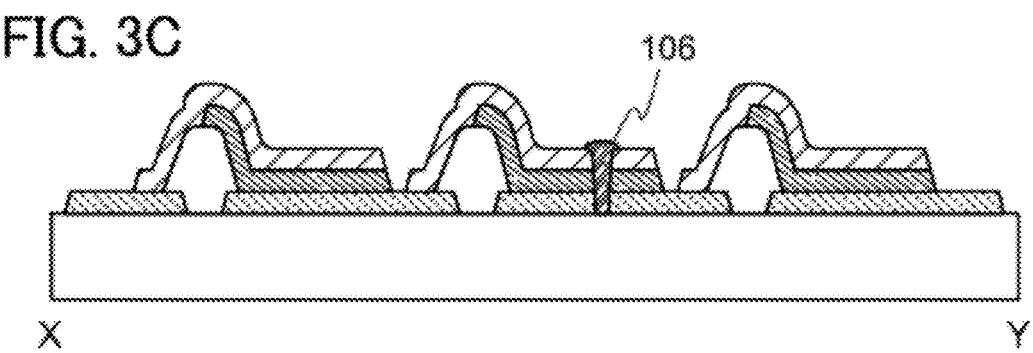
Figure 3D:
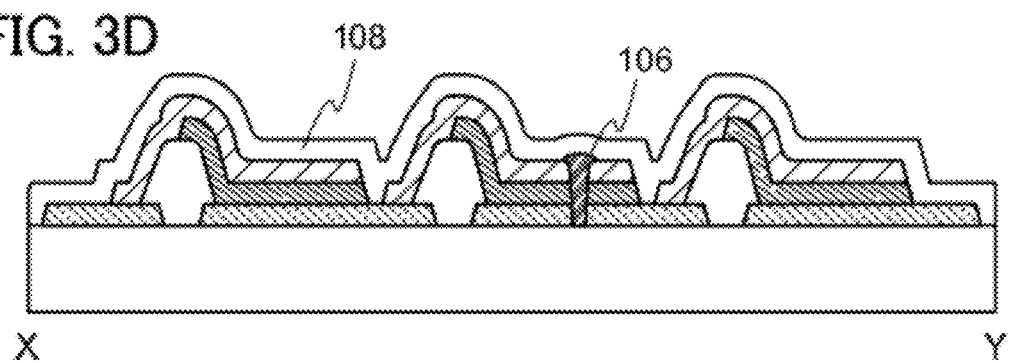

In this embodiment, with the use of the dispensing method, the ultraviolet curable resin is discharged into the region 160 and the resin is cured by irradiation with ultraviolet rays of 10 J/cm$^2$, so that an insulating resin 106 is formed (see FIG. 3C).

Further, treatment for curing the liquid insulating resin may be performed over the entire substrate or may be locally performed on the liquid insulating resin covering the region 160. By performing the treatment locally, the step discharging one short-circuited portion and the step curing the other short-circuited portion can be concurrently performed, whereby throughput can be improved.

Further, for the insulating resin 106, a thermoplastic resin, a solvent volatile resin, or the like can be used. With the use of such a material, treatment for curing the resin can be omitted. Note that treatment by which curing is promoted such as cooling or heating may be performed.

Further, it is important that the insulating resign 106 have a light-transmitting property with respect to the wavelength of light emitted from the electroluminescent layer 104b. Furthermore, it is preferable that the insulating resign 106 be formed using a material having a higher refractive index than the electroluminescent layer 104b. In the case where a material having a high refractive index is used for the insulating resign 106, total reflection of waveguide light of the electroluminescent layer 104b does not occur and the waveguide light can be guided to the insulating resin. Accordingly, light can also be transmitted through the insulating resin 106 outside and yield of a lighting device can be improved in appearance.

Examples of a material which has characteristics as described above and is suitable for the insulating resin 106 include polyethylene terephthalate (PET), triacetyl cellulose (TAC), a resin containing bromine or sulfur such as a sulfur-containing polyimide resin, an episulfide resin, a thiourethane resin, a brominated aromatic resin, or the like, a resin in which particles such as titanium oxide, zirconium oxide, or the like are dispersed, and the like. A resin material having a high refractive index means a resin material having a refractive index of 1.6 to 2.0.

Further, the insulating resin 106 may include a substance which causes scattering of light emitted from the electroluminescent layer 104b. For example, particles of a material having a refractive index which is different from that of a material used as a main component of the insulating resin 106 or particles which reflect the light are dispersed in the insulating resin 106, so that the light emitted from the electroluminescent layer 104b is scattered in the insulating resin 106 and can be easily extracted outside the insulating resin 106. For the particles, for example, particles of glass or particles of metal can be used.

Next, in order to prevent deterioration due to entry of moisture or the like into the electroluminescent layers 104a, 104b, and 104c, the protective film 108 is formed to cover the first light-emitting element 111, the second light-emitting element 112, and the third light-emitting element 113.

With the use of the above method, a problem of a short circuit between an upper electrode and a lower electrode of a light-emitting element can be solved, so that yield of a lighting device can be improved.

This embodiment can be implemented in appropriate combination with the structures described in the other embodiments.

(Embodiment 2)

In this embodiment, a structural example of the electroluminescent layer which can be used for the light-emitting element in Embodiment 1 will be described.

Structural examples of the electroluminescent layers 104a, 104b, and 104c illustrated in FIG. 1A will be described with reference to schematic diagrams of electroluminescent layers in FIGS. 4A to 4C.

Figure 4A:
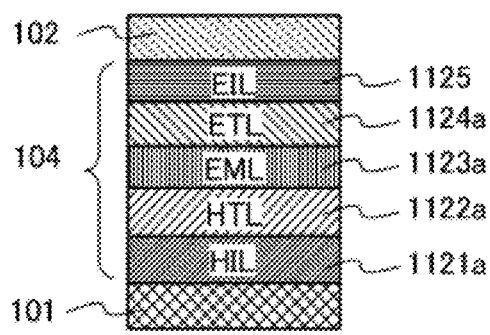
FIGS. 4A to 4C are cross-sectional views each illustrating a structure of an electroluminescent layer.

The electroluminescent layer 104 illustrated in FIG. 4A includes a hole-injection layer (HIL) 1121a, a hole-transport layer (HTL) 1122a, a light-emitting layer (EML) 1123a, an electron-transport layer (ETL) 1124a, and an electron-injection layer (EIL) 1125.

The hole-injection layer 1121a is provided in contact with the first electrode 101 (the first electrode 101a, 101b, or 101c illustrated in FIG. 1A). Note that the hole-injection layer 1121a is not necessarily provided.

The hole-transport layer 1122a is provided over the hole-injection layer 1121a. Note that the hole-transport layer 1122a is not necessarily provided.

The light-emitting layer 1123a is provided over the hole-transport layer 1122a.

The electron-transport layer 1124a is provided over the light-emitting layer 1123a. Note that the electron-transport layer 1124a is not necessarily provided.

The electron-injection layer 1125 is provided over the electron-transport layer 1124a. Note that the electron-injection layer 1125 is not necessarily provided.

Further, a second electrode 102 (the second electrode 102a, 102b, or 102c illustrated in FIG. 1A) is provided in contact with the electron-injection layer 1125.

Note that in the case where the electroluminescent layers 104a, 104b, and 104c illustrated in FIG. 1A each has the structure illustrated in FIG. 4A and a region penetrating the electroluminescent layer 104b from the top surface to the bottom surface of the electroluminescent layer 104b exists in the electroluminescent layer 104b, a defect portion penetrating the electroluminescent layer 104b from the top surface of the electroluminescent layer 104b (the top surface of the electron-injection layer 1125) to the bottom surface of the electroluminescent layer 104b (the hole-injection layer 1121a) exists in the electroluminescent layer 104b. Further, the above defect portion is filled with the insulating resin 106 illustrated in FIG. 1A.

Figure 4B:
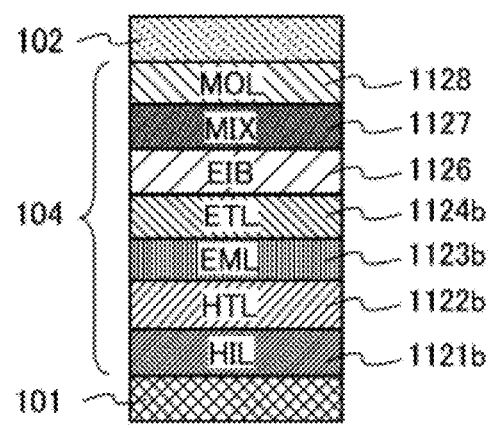

Furthermore, the electroluminescent layer 104 illustrated in FIG. 4B includes a hole-injection layer 1121b, a hole-transport layer 1122b, a light-emitting layer 1123b, an electron-transport layer 1124b, an electron-injection buffer layer (EIB) 1126, a composite material layer (MIX) 1127, and a metal oxide layer (MOL) 1128.

The hole-injection layer 1121b is provided in contact with the first electrode 101 (the first electrode 101a, 101b, and 101c illustrated in FIG. 1A). Note that the hole-injection layer 1121b is not necessarily provided.

The hole-transport layer 1122b is provided over the hole-injection layer 1121b. Note that the hole-transport layer 1122b is not necessarily provided.

The light-emitting layer 1123b is provided over the hole-transport layer 1122b.

The electron-transport layer 1124b is provided over the light-emitting layer 1123b. Note that the electron-transport layer 1124b is not necessarily provided.

The electron-injection buffer layer 1126 is provided over the electron-transport layer 1124b. Note that the electron-injection buffer layer 1126 is not necessarily provided.

The composite material layer 1127 is provided over the electron-injection buffer layer 1126. Note that the composite material layer 1127 is not necessarily provided.

The metal oxide layer 1128 is provided as the uppermost layer of the electroluminescent layer 104 and is provided over the composite material layer 1127 in FIG. 4B.

Further, the second electrode 102 (the second electrode 102a, 102b, and 102c illustrated in FIG. 1A) is provided over and in contact with the metal oxide layer 1128.

Note that in the case where the electroluminescent layers 104a, 104b, and 104c illustrated in FIG. 1A each has the structure illustrated in FIG. 4B and a defect portion penetrating the electroluminescent layer 104b from the top surface to the bottom surface of the electroluminescent layer 104b exists in the electroluminescent layer 104b, the defect portion penetrating the electroluminescent layer 104b from the top surface of the electroluminescent layer 104b (the top surface of the metal oxide layer 1128) to the bottom surface of the electroluminescent layer 104b (the bottom surface of the hole-injection layer 1121b) exists in the electroluminescent layer 104b.

Further, the components of the electroluminescent layers illustrated in FIGS. 4A and 4B will be described.

The hole-injection layer 1121a and the hole-injection layer 1121b are layers for injecting carriers to the hole-transport layer 1122a and the hole-transport layer 1122b, respectively.

A layer containing a substance having a hole-injection property can be used as the hole-injection layer 1121a and the hole-injection layer 1121b.

As the substance having a hole-injection property, for example, molybdenum oxide, vanadium oxide, ruthenium oxide, tungsten oxide, manganese oxide, or the like can be used.

In addition, as the substance having a hole-injection property, phthalocyanine (abbreviation: H$_2$Pc), copper phthalocyanine (abbreviation: CuPc), or the like can also be used.

Other examples of the substance having a hole-injection property include 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)-amino]-9-phenylcarbazole (abbreviation: PCzPCN1).

Other examples of the substance having a hole-injection property include an oligomer, a dendrimer, and a polymer. For example, poly(N-vinylcarbazole) (PVK), poly(4-vinyltriphenylamine) (PVTPA), poly[N-(4-{N'-[4-(4-diphenylamino)phenyl]phenyl-N'-phenylamino}phenyl)methacrylamide] (PTPDMA), poly[N,N'-bis(4-butylphenyl)-N,N'-bis(phenyl)benzidine] (Poly-TPD), or the like can be used.

Other examples of the substance having a hole-injection property include poly(3,4-ethylenedioxythiophene)/poly(styrenesulfonic acid) (PEDOT/PSS) and polyaniline/poly(styrenesulfonic acid) (PAni/PSS).

A layer formed of a composite material containing an organic compound having a hole-transport property and an acceptor substance can be used as the hole-injection layer 1121a and the hole-injection layer 1121b. In this case, the organic compound contained in the composite material preferably has a hole mobility of $10^{-6}$ cm$^2$/Vs or higher. The layer formed of the composite material containing a substance having a high hole-transport property and an acceptor substance is used as the hole-injection layer 1121a and the hole-injection layer 1121b, whereby holes from the first electrode 101a, 101b, or 101c illustrated in FIG. 1A are easily injected, which results in a reduction in the driving voltage of the light-emitting element. The layer formed of a composite material can be formed by, for example, co-evaporation of a substance having a high hole-transport property and an acceptor substance.

Examples of the organic compound contained in the composite material include an aromatic amine compound, a carbazole derivative, an aromatic hydrocarbon, and a high molecular compound (e.g., an oligomer, a dendrimer, or a polymer).

Other examples of the organic compound contained in the composite material include TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl-2,3,5,6-tetraphenylbenzene.

Other examples of the organic compound contained in the composite material include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Other examples of the organic compound contained in the composite material include 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

As the acceptor substance that is an electron acceptor, an organic compound such as 7,7,8,8-tetracyano-2,3,5,6-tetrafluoroquinodimethane (abbreviation: F$_4$-TCNQ) or chloranil, or a transition metal oxide can be used.

As the acceptor substance that is an electron acceptor, an oxide of a metal belonging to any of Groups 4 to 8 of the periodic table can also be used. For example, vanadium oxide, niobium oxide, tantalum oxide, chromium oxide, molybdenum oxide, tungsten oxide, manganese oxide, and rhenium oxide are preferable as the acceptor substance that is an electron acceptor because of their high electron-accepting property. Molybdenum oxide is more preferable because it is stable in the air, has a low hygroscopic property, and is easily handled.

The hole-injection layer 1121a and the hole-injection layer 1121b can be, for example, a layer formed using a composite material of any of the above electron acceptors and a high molecular compound such as PVK, PVTPA, PTPDMA, or Poly-TPD.

The hole-transport layer 1122a and the hole-transport layer 1122b are layers for transporting holes. The hole-transport layer 1122a transports holes to the light-emitting layer 1123a. The hole-transport layer 1122b transports holes to the light-emitting layer 1123b.

A layer containing a substance having a hole-transport property can be used as the hole-transport layer 1122a and the hole-transport layer 1122b.

An aromatic amine compound can be used as the substance having a hole-transport property.

Examples of the substance having a hole-transport property include NPB, TPD, 4,4',4"-tris(carbazol-9-yl)triphenylamine (abbreviation: TCTA), TDATA, MTDATA, 4,4'-bis[N-(spiro-9,9'-bifluoren-2-yl)-N-phenylamino]biphenyl (abbreviation: BSPB), PCzPCA1, PCzPCA2, and PCzPCN1.

The hole-transport layer 1122a and the hole-transport layer 1122b can be a layer containing CBP, TCPB, CzPA, or the like.

The hole-transport layer 1122a and the hole-transport layer 1122b can also be a layer containing PVK, PVTPA, PTPDMA, Poly-TPD, or the like.

Note that the hole-transport layer 1122a and the hole-transport layer 1122b can also be a stack of layers formed using materials applicable to the hole-transport layer 1122a and the hole-transport layer 1122b.

The light-emitting layer 1123a and the light-emitting layer 1123b are each a layer containing a light-emitting substance.

The light-emitting layer 1123a and the light-emitting layer 1123b can be, for example, a layer containing a host material and a fluorescent compound or a phosphorescent compound.

Examples of the fluorescent compound include a fluorescent material which emits blue light (blue fluorescent material), a fluorescent material which emits green light (green fluorescent material), a fluorescent material which emits yellow light (yellow fluorescent material), and a fluorescent material which emits red light (red fluorescent material).

Examples of the blue fluorescent material include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviated to PCBAPA).

Examples of the green fluorescent material include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA).

Examples of the yellow fluorescent material include rubrene and 5,12-bis(1,1'-biphenyl-4-yl)-6,11-diphenyltetracene (abbreviation: BPT).

Examples of the red fluorescent material include N,N,N',N'-tetrakis(4-methylphenyl)tetracene-5,11-diamine (abbreviation: p-mPhTD) and 7,14-diphenyl-N,N,N',N'-tetrakis(4-methylphenyl)acenaphtho[1,2-a]fluoranthene-3,10-diamine (abbreviation: p-mPhAFD).

Examples of the phosphorescent compound include a phosphorescent material which emits blue light (blue phosphorescent material), a phosphorescent material which emits green light (green phosphorescent material), a phosphorescent material which emits yellow light (yellow phosphorescent material), a phosphorescent material which emits orange light (orange phosphorescent material), and a phosphorescent material which emits red light (red phosphorescent material).

Examples of the blue phosphorescent material include bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis{2-[3',5'-bis(trifluoromethyl)phenyl]pyridinato-N,$C^{2'}$}iridium(III)picolinate (abbreviation: Ir(CF$_3$ppy)$_2$(pic)), and bis[2-(4',6'-difluorophenyl)pyridinato-N,$C^{2'}$]iridium(III)acetylacetonate (abbreviation: FIr(acac).

Examples of the green phosphorescent material include tris(2-phenylpyridinato-N,$C^{2'}$)iridium(III) (abbreviation: Ir(ppy)$_3$), bis[2-phenylpyridinato-N,$C^{2'}$]iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III) acetylacetonate (abbreviation: Ir(bzq)$_2$(acac)), and tris(benzo[h]quinolinato)iridium(III) (abbreviation: Ir(bzq)$_3$).

Examples of the yellow phosphorescent material include bis(2,4-diphenyl-1,3-oxazolato-N,$C^{2'}$)iridium(III)acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis{2-(4-methoxyphenyl)-3,5-dimethylpyrazinato}iridium(III) (abbreviation: Ir(dmmoppr)$_2$(acac)).

Examples of the orange phosphorescent material include tris(2-phenylquinolinato-N,$C^{2'}$)iridium(III) (abbreviation: Ir(pq)$_3$), bis(2-phenylquinolinato-N,$C^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)).

Examples of the red phosphorescent material include bis[2-(2'-benzo[4,5-α]thienyl)pyridinato-N,$C^{3'}$)iridium(III) acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), and (2,3,7,8,12,13,17,18-octaethyl-21H,23H-porphine)platinum(II) (abbreviation: PtOEP).

A rare earth metal complex can be used as the phosphorescent compound. The rare earth metal complex emits light from a rare earth metal ion (electron transition between different multiplicities), and thus can be used as the phosphorescent compound. Examples of the phosphorescent compound that can be used include tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)).

The light-emitting layer 1123a and the light-emitting layer 1123b may be a layer in which the light-emitting substance (guest material) is dispersed in another substance (host material). A substance which has a higher lowest unoccupied molecular orbital level (LUMO level) than the light-emitting substance and has a lower highest occupied molecular orbital level (HOMO level) than the light-emitting substance is preferably used as the host material.

Examples of the host material include a metal complex, a heterocyclic compound, a condensed aromatic compound, and an aromatic amine compound.

Examples of the host material include tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ), 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2′,2″-(1,3,5-benzenetriyl)tris(1-phenyl-1H-benzimidazole) (abbreviation: TPBI), bathophenanthroline (abbreviation: BPhen), bathocuproine (abbreviation: BCP), CzPA, 3,6-diphenyl-9-[4-(10-phenyl-9-anthryl)phenyl]-9H-carbazole (abbreviation: DPCzPA), DNA, t-BuDNA, 9,9′-bianthryl (abbreviation: BANT), 9,9′-(stilbene-3,3′-diyl)diphenanthrene (abbreviation: DPNS), 9,9′-(stilbene-4,4′-diyl)diphenanthrene (abbreviation: DPNS2), 3,3′,3‴-(benzene-1,3,5-triyl)tripyrene (abbreviation: TPB3), DPAnth, 6,12-dimethoxy-5,11-diphenylchrysene, N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB, TPD, DFLDPBi, and BSPB.

The host material can include a plurality of the above materials applicable to the host material.

The light-emitting layer 1123a and the light-emitting layer 1123b are formed of a layer in which a guest material is dispersed in a host material, whereby the crystallization of the light-emitting layer 1123a and the light-emitting layer 1123b can be prevented and concentration quenching due to high concentration of the guest material can also be prevented.

The light-emitting layer 1123a and the light-emitting layer 1123b can be a layer containing a light-emitting substance that is a high molecular compound.

Examples of the light-emitting substance that is a high molecular compound include poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N′-di-(p-butylphenyl)-1,4-diaminobenzene]} (abbreviation: TAB-PFH), poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenefluorenylene)-alt-co-(2-methoxy-5-(2-ethylhexyloxy)-1,4-phenylene)], poly[2-methoxy-5-(2′-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N′-diphenyl amino)-1,4-phenylene]}, and poly{[2-methoxy-5-(2-ethylhexyloxy)-1,4-bis(1-cyanovinylenephenylene)]-alt-co-[2,5-bis(N,N′-diphenylamino)-1,4-phenylene]} (abbreviation: CN-PPV-DPD).

Note that the light-emitting layer 1123a and the light-emitting layer 1123b can also be a stack of layers applicable to the light-emitting layer 1123a and the light-emitting layer 1123b. For example, by stacking light-emitting layers which emit light of different colors, a variety of emission colors can be obtained and the luminance can be improved. For example, by stacking a layer formed using a material which emits light of a first color and a layer formed using a material which emits light of a color which is complementary to the first color, a light-emitting layer which emits white light can be formed. A light-emitting layer which emits white light can be formed by, for example, stacking a light-emitting layer which emits blue light and a light-emitting layer which emits yellow light, or a light-emitting layer which emits blue green light and a light-emitting layer which emits red light.

In that case, by providing a charge generation layer between the light-emitting layers, the luminance of the light-emitting element can be improved while the current density of the light-emitting element is kept low, which results in an increase in the lifetime of the light-emitting element.

The electron-transport layer 1124a and the electron-transport layer 1124b are layers for transporting electrons. The electron-transport layer 1124a transports electrons to the light-emitting layer 1123a. The electron-transport layer 1124b transports electrons to the light-emitting layer 1123b.

The electron-transport layer 1124a and the electron-transport layer 1124b can be a layer containing a substance having an electron-transport property.

Examples of the substance having an electron-transport property include Alq, Almq$_3$, BeBq$_2$, BAlq, Zn(BOX)$_2$, Zn(BTZ)$_2$, PBD, OXD-7, CO11, TAZ, BPhen, BCP, PF-Py, and PF-BPy.

Note that the electron-transport layer 1124a and the electron-transport layer 1124b can be a stack of layers of materials applicable to the electron-transport layer 1124a and the electron-transport layer 1124b.

The electron-injection layer 1125 is a layer for injecting electrons.

The electron-injection layer 1125 can be a layer containing an alkali metal, an alkaline earth metal, a compound thereof, or the like. A layer formed using a material applicable to the electron-transport layer, in which an alkali metal, an alkaline earth metal, a compound thereof, or the like is contained, can also be used as the electron-injection layer 1125.

The hole-injection layers 1121a and 1121b, the hole-transport layers 1122a and 1122b, the light-emitting layers 1123a and 1123b, the electron-transport layers 1124a and 1124b, and the electron-injection layer 1125 can be formed by a method such as an evaporation method (including a vacuum evaporation method), an inkjet method, or a coating method.

The electron-injection buffer layer 1126 is a layer which reduces the barrier for electron injection into the light-emitting layer 1123b.

The electron-injection buffer layer 1126 can be a layer containing a material having an electron-injection property, a material having a donor property, and a material having an electron-transport property.

Examples of the material having an electron-injection property or the material having a donor property include metal materials such as an alkali metal, an alkaline earth metal, and a rare earth metal, and a compound of the metal material.

Examples of the substance having an electron-transport property include Alq, Almq$_3$, BeBq$_2$, BAlq, Zn(BOX)$_2$, Zn(BTZ)$_2$, PBD, OXD-7, CO11, TAZ, BPhen, BCP, PF-Py, and PF-BPy.

The composite material layer 1127 is a layer for transporting electrons.

The composite material layer 1127 can be a layer formed using a composite material in which an acceptor substance is contained in the substance having a hole-transport property.

The metal oxide layer 1128 is a protective layer. The metal oxide layer 1128 is provided, whereby the deterioration of the electroluminescent layers 104a, 104b, and 104c illustrated in FIG. 1A at the time of the manufacture of the light-emitting element can be suppressed.

The metal oxide layer 1128 can be, for example, a transition metal oxide layer or a layer of an oxide of a metal belonging to any of Groups 4 to 8 of the periodic table. Examples of the metal oxide layer include layers containing vanadium oxide, niobium oxide, tantalum oxide, chromium oxide, molybdenum oxide, tungsten oxide, manganese oxide, and rhenium oxide. The metal oxide layer 1128 can also be a stack of layers formed using materials applicable to the metal oxide layer 1128. For example, molybdenum oxide, which has a low hygroscopic property, is used for forming the metal oxide layer 1128, whereby the deterioration of the electroluminescent layer at the time of the manufacture of the light-emitting element can be suppressed; thus, a reduction in a light-emitting property of the light-emitting element can be suppressed.

The above are the structural examples of the electroluminescent layers illustrated in FIGS. 4A and 4B.

Note that an electroluminescent layer of a light-emitting element may be formed by stacking a plurality of the electroluminescent layers 104 illustrated in FIGS. 4A and 4B. As for a light-emitting element having such a structure, problems such as energy transfer and quenching hardly occur, and a light-emitting element which has both high emission efficiency and long lifetime can be easily obtained due to expansion in the choice of materials. Moreover, a light-emitting element which provides phosphorescence from one electroluminescent layer and fluorescence from another electroluminescent layer can be easily obtained.

Figure 4C:
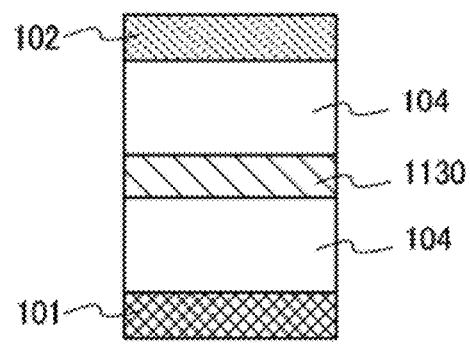

FIG. 4C illustrates an example of a structure in which a plurality of the electroluminescent layers 104 is stacked. FIG. 4C illustrates a structure in which two electroluminescent layers 104 and a charge generation layer 1130 interposed therebetween are provided between a first electrode and a second electrode. A material having a high light-transmitting property is necessary to be used for the charge generation layer 1130 which is a layer for injecting carriers. Note that FIG. 4C illustrates a structure in which two electroluminescent layers 104 are stacked; however, the present invention is not limited thereto and a structure in which three or more electroluminescent layers 104 are stacked may be employed.

With the structure in which the electroluminescent layers 104 are stacked, as the number of layers to be stacked increases, luminance increases even at the same amount of current. The structure in which the electroluminescent layers 104 are stacked is preferably used particularly for lighting devices that require high luminance. Further, when the structure in which the plurality of the electroluminescent layers 104 is stacked is employed, the electroluminescent layers 104 may be formed using the same material or different materials.

For example, the electroluminescent layers 104 formed using materials which emit light of red (R), green (G), and blue (B) are stacked, whereby white light emission can also be obtained as a whole. It is preferable that the materials which emit light of red (R), green (G), and blue (B) be each formed by an evaporation method using an evaporation mask, a droplet discharging method (also referred to as an ink-jet method), or the like. Specifically, for the hole-injection layer, the hole-transport layer, the electron-transport layer, and the electron-injection layer, CuPc or PEDOT, α-NPD, BCP or Alq$_3$, and BCP:Li or CaF$_2$ can be used, respectively. For example, Alq$_3$ doped with a dopant corresponding to each luminescent color of R, G, and B (DCM or the like for R, and DMQD or the like for G) may be used for the light-emitting layer. Note that in order to obtain white light emission, the present invention is not limited to the structure in which the electroluminescent layers 104 formed using respective light-emitting materials of the above three colors are stacked. A structure in which the electroluminescent layers 104 formed using respective light-emitting materials of two colors are stacked may be employed. For example, the electroluminescent layer 104 formed using a material which emits light of blue and the electroluminescent layer 104 formed using a material which emits light of yellow are stacked, whereby white light emission can also be obtained.

Note that a structure of a layer containing a light-emitting substance is not limited to the above stacked structures. For example, the layer containing a light-emitting substance may have any one of a single layer structure, a stacked layer structure, and a mixed structure having no interface between layers. Further, a fluorescent material, a phosphorescent material, or a material including these in combination can be used. For example, a phosphorescent material can be used for the material which emits light of red and a fluorescent material can be used for the material which emits light of green or the material which emits light of blue. Further, an organic material including a low molecular material, a high molecular material, and a medium molecular material can be used. Note that a medium molecular material corresponds to a low polymer in which the number of repetitions of a structural unit (the degree of polymerization) is about 2 to 20. Alternatively, any of an inorganic material typified by molybdenum oxide or the like superior in an electron-injection property and a compound material of the organic material and the inorganic material may also be used.

According to the structural examples of the electroluminescent layers of the light-emitting element in this embodiment, which are described with reference to FIGS. 4A to 4C, the electroluminescent layer includes at least the light-emitting layer.

Further, according to the structural examples of the electroluminescent layers of the light-emitting element in this embodiment, the electroluminescent layer is the stack including the light-emitting layer and the metal oxide layer which is the top layer of the stack. This structure allows the deterioration of the electroluminescent layer at the time of the manufacture of the light-emitting element to be suppressed.

This embodiment can be implemented in appropriate combination with the structures described in the other embodiments.

(Embodiment 3)

In this embodiment, examples of devices each including the lighting device manufactured by the method for manufacturing a lighting device in any of the above embodiments will be described.

FIGS. 5A and 5B and FIGS. 6A to 6D are schematic views illustrating the examples of the lighting device manufactured by the method for manufacturing a lighting device in this embodiment.

Figure 5A:
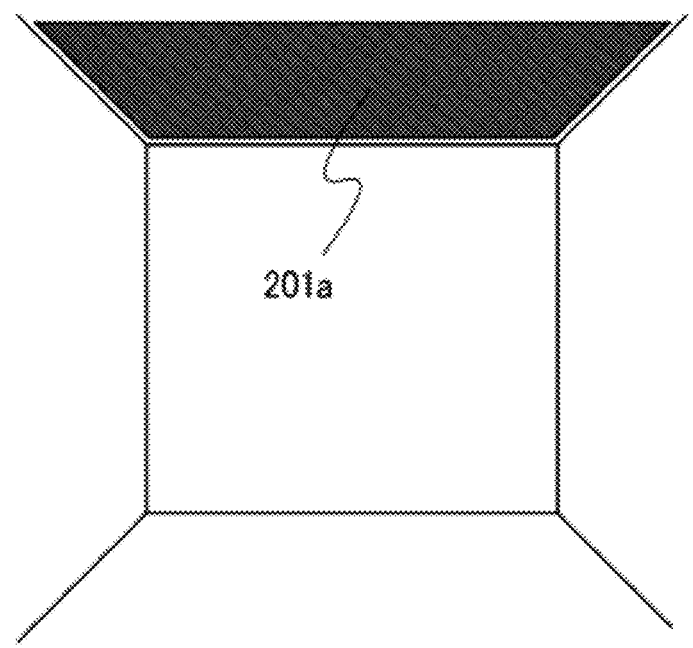
FIGS. 5A and 5B each illustrate a device to which a lighting device is applied.

FIG. 5A is a schematic view illustrating an example of a lighting device (i.e., a lighting device 201a) provided on a ceiling in a room.

The lighting device 201a includes a light-emitting element and a control circuit for controlling light emission of the light-emitting element. With the use of the method for manufacturing a lighting device according to one embodiment of the present invention, such a large-area lighting device can be formed with high yield.

Figure 5B:
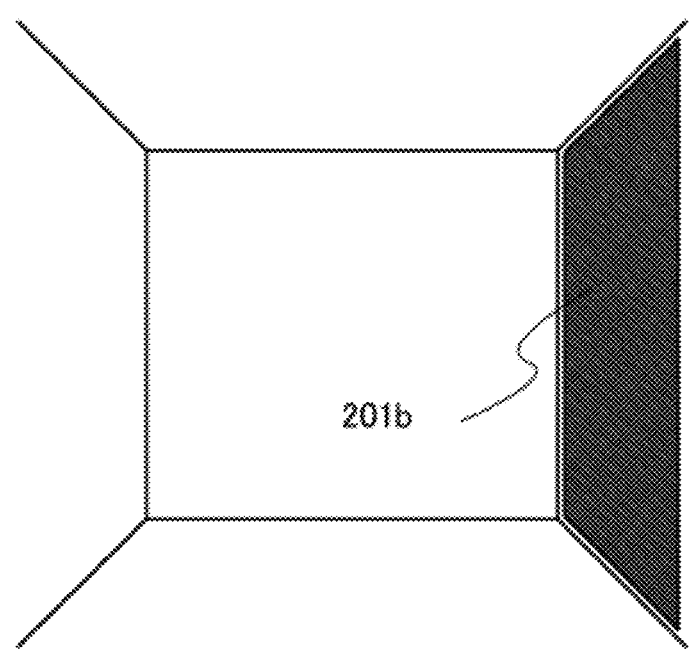

Further, FIG. 5B is a schematic view illustrating an example of a lighting device (i.e., a lighting device 201b) provided on a wall in a room.

The lighting device 201b includes a light-emitting element and a control circuit for controlling light emission of the light-emitting element. In addition, a light-transmitting glass substrate is used as a substrate used in the lighting device 201b, whereby the lighting device 201b can be used as window glass.

Further, as a light unit which emits light to a display portion in a liquid crystal display device or the like, the lighting device manufactured by the method for manufacturing a lighting device according to one embodiment of the present invention can be used. Examples of devices each including the lighting device will be described below.

Figure 6A:
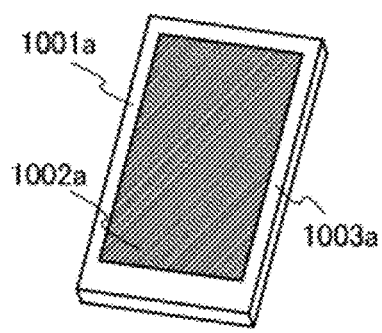
FIGS. 6A to 6D each illustrate a device to which a lighting device is applied.

A device illustrated in FIG. 6A is an example of a portable information terminal. The information terminal illustrated in FIG. 6A includes a housing 1001a and a display portion 1002a provided in the housing 1001a.

Note that a side surface 1003a of the housing 1001a may be provided with a connection terminal to which an external device is connected and one or plural buttons for operating the portable information terminal illustrated in FIG. 6A.

The portable information terminal illustrated in FIG. 6A includes, in the housing 1001a, a CPU, a main memory, an interface with which signals are transmitted/received between the external device and the CPU and the main memory, an antenna which transmits and receives the signals to/from the external device, and a light unit which emits light to the display portion 1002a. Note that one or more integrated circuits with a specific function may be provided in the housing 1001a.

The portable information terminal illustrated in FIG. 6A serves, for example, as one or more of a telephone set, an e-book reader, a personal computer, and a game machine.

Figure 6C:
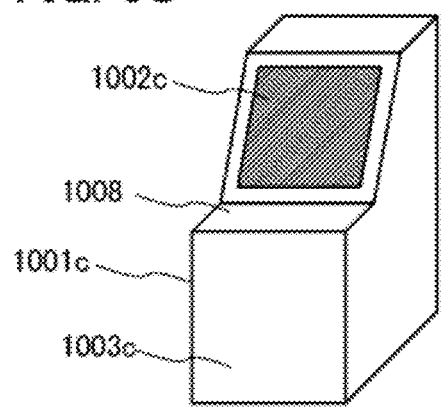
Figure 6B:
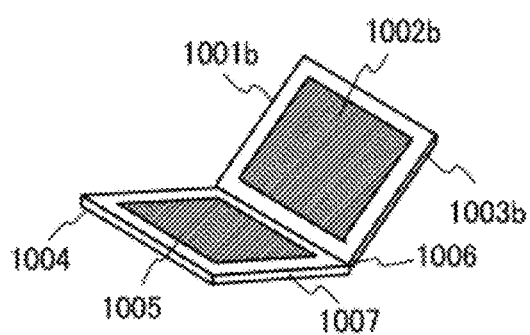

A device illustrated in FIG. 6B is an example of a foldable portable information terminal. The portable information terminal illustrated in FIG. 6B includes a housing 1001b, a display portion 1002b provided in the housing 1001b, a housing 1004, a display portion 1005 provided in the housing 1004, and a hinge 1006 for connecting the housing 1001b and the housing 1004.

In the portable information terminal illustrated in FIG. 6B, the housing 1001b can be stacked on the housing 1004 by moving the housing 1001b or the housing 1004 with the hinge 1006.

Note that a side surface 1003b of the housing 1001b or a side surface 1007 of the housing 1004 may be provided with a connection terminal to which an external device is connected and one or more buttons for operating the portable information terminal illustrated in FIG. 6B.

The display portion 1002b and the display portion 1005 may display different images or one image. Note that the display portion 1005 is not necessarily provided; a keyboard which is an input device may be provided instead of the display portion 1005.

The portable information terminal illustrated in FIG. 6B includes, in the housing 1001b or the housing 1004, a CPU, a main memory, an interface with which signals are transmitted/received between the external device and the CPU and the main memory, and a light unit which emits light to the display portion 1002b and the display portion 1005. Note that one or more integrated circuits with a specific function may be provided in the housing 1001b or the housing 1004. In addition, the portable information terminal illustrated in FIG. 6B may include an antenna transmitting/receiving a signal to/from the external device.

The portable information terminal illustrated in FIG. 6B serves, for example, as one or more of a telephone set, an e-book reader, a personal computer, and a game machine.

A device illustrated in FIG. 6C is an example of a stationary information terminal. The stationary information terminal illustrated in FIG. 6C includes a housing 1001c and a display portion 1002c provided in the housing 1001c.

Note that the display portion 1002c can also be provided on a deck portion 1008 of the housing 1001c.

The stationary information terminal illustrated in FIG. 6C includes, in the housing 1001c, a CPU, a main memory, an interface with which signals are transmitted/received between the external device and the CPU and the main memory, and a light unit which emits light to the display portion 1002c. Note that one or more integrated circuits with a specific function may be provided in the housing 1001c. In addition, the stationary information terminal illustrated in FIG. 6C may include an antenna transmitting/receiving a signal to/from the external device.

Further, a side surface 1003c of the housing 1001c of the stationary information terminal illustrated in FIG. 6C may be provided with one or more of a ticket slot from which a ticket or the like is dispensed, a coin slot, and a bill slot.

The stationary information terminal illustrated in FIG. 6C serves, for example, as an automated teller machine, an information communication terminal for ticketing or the like (also referred to as a multi-media station), or a game machine.

Figure 6D:
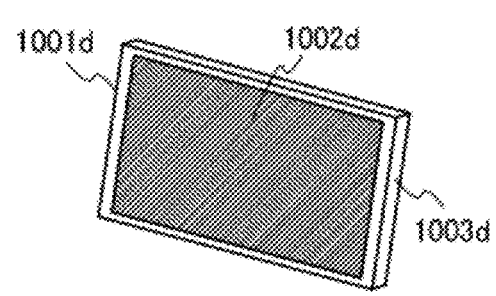

FIG. 6D illustrates another example of a stationary information terminal. The stationary information terminal illustrated in FIG. 6D includes a housing 1001d and a display portion 1002d provided in the housing 1001d. Note that a support for supporting the housing 1001d may also be provided.

Note that a side surface 1003d of the housing 1001d may be provided with a connection terminal to which an external device is connected and one or plural buttons for operating the stationary information terminal in FIG. 6D.

The stationary information terminal illustrated in FIG. 6D includes, in the housing 1001d, a light unit which emits light to the display portion 1002d. The stationary information terminal illustrated in FIG. 6D may also include, in the housing 1001d, a CPU, a main memory, and an interface with which signals are transmitted/received between the external device and the CPU and the main memory. One or more integrated circuits with a specific function may be provided in the housing 1001*d*. In addition, the stationary information terminal illustrated in FIG. 6D may include an antenna transmitting/receiving a signal to/from the external device.

The stationary information terminal illustrated in FIG. 6D serves, for example, as a digital photo frame, an input-output monitor, or a television device.

In each of the devices illustrated in FIGS. 6A to 6D, the lighting device manufactured by the method for manufacturing a lighting device according to one embodiment of the present invention can be used in the light-emitting portion of the light unit provided in the housing. Further, the lighting device can be used in a light-emitting portion of a lighting device such as a desk lamp, an electronic signboard, an outdoor light, or a portable light source.

This embodiment can be implemented in appropriate combination with the structures described in the other embodiments.

This application is based on Japanese Patent Application serial no. 2010-293534 filed with Japan Patent Office on Dec. 28, 2010, the entire contents of which are hereby incorporated by reference.

What is claimed is:

1. A method for manufacturing a lighting device, comprising the steps of:
    forming a first electrode and a second electrode over a substrate;
    forming a light-emitting layer over the second electrode;
    forming a third electrode over the light-emitting layer and the first electrode;
    specifying a short-circuited portion between the second electrode and the third electrode by applying a voltage between the first electrode and the second electrode;
    forming a region where the short-circuited portion is removed by irradiation with a laser beam;
    filling the region with an insulating resin; and
    curing the insulating resin,
    wherein the third electrode is in contact with the first electrode, and
    wherein the insulating resin is in contact with the substrate, the second electrode, and the third electrode.

2. A method for manufacturing a lighting device, comprising the steps of:
    forming a first electrode, a second electrode, and a third electrode over a substrate;
    forming a first light-emitting layer over the second electrode and a second light-emitting layer over the third electrode;
    forming a fourth electrode over the first light-emitting layer and the first electrode and a fifth electrode over the second light-emitting layer and the second electrode;
    specifying at least one of a short-circuited portion between the second electrode and the fourth electrode and a short-circuited portion between the third electrode and the fifth electrode by applying a voltage between the first electrode and the third electrode;
    forming a region where the short-circuited portion is removed by irradiation with a laser beam;
    filling the region with an insulating resin; and
    curing the insulating resin,
    wherein the fourth electrode is in contact with the first electrode, and the fifth electrode is in contact with the second electrode, and
    wherein the insulating resin is in contact with the substrate, the second electrode, and the fourth electrode, and/or the substrate, the third electrode, and the fifth electrode.

3. The method for manufacturing a lighting device, according to claim 1,
    wherein the light-emitting layer includes a metal oxide layer, and
    wherein a material of the metal oxide layer is selected from vanadium oxide, niobium oxide, tantalum oxide, chromium oxide, molybdenum oxide, tungsten oxide, manganese oxide, and rhenium oxide.

4. The method for manufacturing a lighting device, according to claim 1, wherein an auxiliary electrode is provided with the first electrode and the second electrode, or the third electrode.

5. The method for manufacturing a lighting device, according to claim 1, wherein the short-circuited portion is specified by detecting a change in a state of at least one of the second electrode, the light-emitting layer, and the third electrode caused by applying the voltage between the first electrode and the second electrode.

6. The method for manufacturing a lighting device, according to claim 1, wherein the short-circuited portion is specified by observing a surface condition of at least one of the second electrode, the light-emitting layer, and the third electrode and detecting a defective portion by an image analysis.

7. The method for manufacturing a lighting device, according to claim 1, wherein the insulating resin has a light-transmitting property and a higher refractive index than the light-emitting layer.

8. The method for manufacturing a lighting device, according to claim 1, wherein the insulating resin includes a particle which causes scattering of light.

9. A method for manufacturing a lighting device, comprising the steps of:
    forming a first electrode and a second electrode over a substrate;
    forming a partition over the first electrode and the second electrode to cover a part of the first electrode and a part of the second electrode;
    forming a light-emitting layer over the second electrode and the partition;
    forming a third electrode over the light-emitting layer and the first electrode;
    specifying a short-circuited portion between the second electrode and the third electrode by applying a voltage between the first electrode and the second electrode;
    forming a region where the short-circuited portion is removed by irradiation with a laser beam;
    filling the region with an insulating resin; and
    curing the insulating resin,
    wherein the third electrode extends beyond the partition to be in contact with the first electrode, and
    wherein the insulating resin is in contact with the substrate, the second electrode, and the third electrode.

10. The method for manufacturing a lighting device, according to claim 9,
    wherein the light-emitting layer includes a metal oxide layer, and
    wherein a material of the metal oxide layer is selected from vanadium oxide, niobium oxide, tantalum oxide, chromium oxide, molybdenum oxide, tungsten oxide, manganese oxide, and rhenium oxide.

11. The method for manufacturing a lighting device, according to claim 9, wherein an auxiliary electrode is provided with the first electrode and the second electrode, or the third electrode.

12. The method for manufacturing a lighting device, according to claim 9, wherein the short-circuited portion is specified by detecting a change in a state of at least one of the second electrode, the light-emitting layer, and the third electrode caused by applying the voltage between the first electrode and the second electrode.

13. The method for manufacturing a lighting device, according to claim 9, wherein the short-circuited portion is specified by observing a surface condition of at least one of the second electrode, the light-emitting layer, and the third electrode and detecting a defective portion by an image analysis.

14. The method for manufacturing a lighting device, according to claim 9, wherein the insulating resin has a light-transmitting property and a higher refractive index than the light-emitting layer.

15. The method for manufacturing a lighting device, according to claim 9, wherein the insulating resin includes a particle which causes scattering of light.

16. A method for manufacturing a lighting device, comprising the steps of:
    forming a first electrode, a second electrode, and a third electrode over a substrate;
    forming a first partition over the first electrode and the second electrode to cover a part of the first electrode and a part of the second electrode, and a second partition over the second electrode and the third electrode to cover a part of the second electrode and a part of the third electrode;
    forming a first light-emitting layer over the second electrode and the first partition and a second light-emitting layer over the third electrode and the second partition;
    forming a fourth electrode over the first light-emitting layer and the first electrode and a fifth electrode over the second light-emitting layer and the second electrode;
    specifying at least one of a short-circuited portion between the second electrode and the fourth electrode and a short-circuited portion between the third electrode and the fifth electrode by applying a voltage between the first electrode and the third electrode;
    forming a region where the short-circuited portion is removed by irradiation with a laser beam;
    filling the region with an insulating resin; and
    curing the insulating resin,
    wherein the fourth electrode extends beyond the first partition to be in contact with the first electrode and the fifth electrode extends beyond the second partition to be in contact with the second electrode, and
    wherein the insulating resin is in contact with the substrate, the second electrode, and the fourth electrode, and/or the substrate, the third electrode, and the fifth electrode.

17. The method for manufacturing a lighting device, according to claim 2,
    wherein the first light-emitting layer and the second light-emitting layer each include a metal oxide layer, and
    wherein a material of the metal oxide layer is selected from vanadium oxide, niobium oxide, tantalum oxide, chromium oxide, molybdenum oxide, tungsten oxide, manganese oxide, and rhenium oxide.

18. The method for manufacturing a lighting device, according to claim 16,
    wherein the first light-emitting layer and the second light-emitting layer each include a metal oxide layer, and
    wherein a material of the metal oxide layer is selected from vanadium oxide, niobium oxide, tantalum oxide, chromium oxide, molybdenum oxide, tungsten oxide, manganese oxide, and rhenium oxide.

19. The method for manufacturing a lighting device, according to claim 2, wherein an auxiliary electrode is provided with the first electrode, the second electrode, and the third electrode, or the fourth electrode and the fifth electrode.

20. The method for manufacturing a lighting device, according to claim 19, wherein an auxiliary electrode is provided with the first electrode, the second electrode, and the third electrode, or the fourth electrode and the fifth electrode.

21. The method for manufacturing a lighting device, according to claim 2, wherein the insulating resin has a light-transmitting property and a higher refractive index than the first light-emitting layer and the second light-emitting layer.

22. The method for manufacturing a lighting device, according to claim 16, wherein the insulating resin has a light-transmitting property and a higher refractive index than the first light-emitting layer and the second light-emitting layer.

23. The method for manufacturing a lighting device, according to claim 2, wherein the insulating resin includes a particle which causes scattering of light.

24. The method for manufacturing a lighting device, according to claim 16, wherein the insulating resin includes a particle which causes scattering of light.

* * * * *

UNITED STATES PATENT AND TRADEMARK OFFICE
CERTIFICATE OF CORRECTION

| | |
|---|---|
| PATENT NO. | : 8,557,614 B2 |
| APPLICATION NO. | : 13/336356 |
| DATED | : October 15, 2013 |
| INVENTOR(S) | : Shunpei Yamazaki et al. |

It is certified that error appears in the above-identified patent and that said Letters Patent is hereby corrected as shown below:

In the Claims:

At column 24, line 27 (claim 20), "claim 19" should be --claim 16--.

Signed and Sealed this
Twenty-eighth Day of January, 2014

Michelle K. Lee
*Deputy Director of the United States Patent and Trademark Office*